(12) United States Patent
De Ambroggi et al.

(10) Patent No.: US 6,366,634 B2
(45) Date of Patent: Apr. 2, 2002

(54) ACCELERATED CARRY GENERATION

(75) Inventors: Luca Giuseppe De Ambroggi, Catania; Salvatore Nicosia, Palermo; Francesco Tomaiuolo, Monte Sant' Angelo; Fabrizio Campanale, Bari; Promod Kumar, Motta S. Anastasia; Carmelo Condemi, Gravina, all of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/774,878

(22) Filed: Jan. 31, 2001

(30) Foreign Application Priority Data

Jan. 31, 2000 (EP) .............................................. 00830068
Apr. 27, 2000 (EP) .............................................. 00830312

(51) Int. Cl.$^7$ ................................................ G06M 3/00
(52) U.S. Cl. ............................. 377/26; 377/51; 365/236
(58) Field of Search ...................... 377/26, 51; 365/236

(56) References Cited

U.S. PATENT DOCUMENTS

| | | | |
|---|---|---|---|
| 5,077,686 A | * 12/1991 | Rubinstein | ................... 395/550 |
| 5,559,990 A | 9/1996 | Cheng et al. | ............. 3995/484 |
| 5,596,539 A | 1/1997 | Passow et al. | .............. 365/210 |
| 5,696,917 A | 12/1997 | Mills et al. | .................. 395/401 |
| 5,966,724 A | 10/1999 | Ryan | ........................... 711/105 |

FOREIGN PATENT DOCUMENTS

| EP | 0561370 | 9/1993 | ............ G11C/7/00 |
|---|---|---|---|
| EP | 0961283 | 12/1999 | ............ G11C/7/00 |

* cited by examiner

*Primary Examiner*—Margaret R. Wambach
(74) *Attorney, Agent, or Firm*—Lisa K. Jorgenson; Allen, Dyer, Doppelt, Milbrath & Gilchrist, P.A.

(57) ABSTRACT

An address binary counter for an interleaved having an array of memory cells being divided into a first bank of memory cells and a second bank of memory cells includes as many stages as the bits that may be stored in the memory cells of a row of one of the banks, and a carry calculation network. The interleaved memory operates in a burst access mode enabled by an enabling signal. The carry calculation network includes an ordered group of independent carry generators. Each independent carry generator includes a certain number of stages, with each stage having inputs receiving its own enabling bit and a number of consecutive bits of a row of the bank equal to the number of stages, orderly starting from the least significant bit. The enabling bit of the first carry generator of the ordered group is the enabling signal, and the enabling bit of any other carry generator of the ordered group is the logic AND of the enabling signal and of the input bits of the preceding carry generator of the ordered group.

21 Claims, 8 Drawing Sheets

ACCELERATED CARRY GENERATION

FIELD OF THE INVENTION

The present invention relates in general to memory-devices, and in particular, to an interleaved memory readable in a synchronous mode or in a random access asynchronous mode with fast access times. The interleaved memory is readable in the synchronous mode by successive locations with a sequential type of access, commonly referred to as a burst mode.

BACKGROUND OF THE INVENTION

In a standard memory a read cycle is defined from a request of data effected by the input of a new address, to the final output of the bits stored in the addressed location (byte, word, etc.). Internally, the reading process evolves through several steps. These steps start from the acquisition of the new address, to its decoding, to the generation of synchronizing pulses of the sensing circuits, and to the output of the read data.

The ATD (Address Transition Detection) signal recognizes a change of the address input by the external circuitry, and therefore, the new request of access and initiates a new read cycle. After enabling the sense amplifiers by the signal SAenable, an equalization of the sensing circuitry takes place. At the end of which, as timed by the signal EQZ, the effective reading of the memory cells takes place. Finally, after a certain interval of time that may vary from device to device, by way of a signal SAlatch, the recording of the read data into the latches in cascade to the sense amplifiers takes place, from where the read word may be transferred to the output buffers.

In memory devices designed for a synchronous read mode with a sequential type (burst) of access, the reading process exploits the fact that the reading takes place by successive locations. That is, the subsequent memory location to be read, and therefore, its address, is predictable from the address of the location being currently read.

A subgroup of these sequential (burst) synchronous read mode memories is represented by the interleaved memories. A burst access interleaved memory is described in U.S. Pat. No. 5,559,990, for example. In this type of memory, the cell array is divided in two semi-arrays or banks, each having its own read circuitry. The read streams of the two banks are thereafter superimposed according to one of the most commonly followed approaches. They are outphased, i.e., out of phase, from each other. While on one of the two banks or semi-array the steps of evaluation and transfer of the data to the output are being performed, on the other bank or semi-array (the next location to be addressed) a new read cycle may start without waiting for the conclusion of the current read cycle that involves the first semi-array.

In interleaved memories, a basic scheme of which is depicted in FIG. 1, the array is divided into two independent banks or semi-arrays, EVEN and ODD, respectively, each having its own independent read path. Typically, there are two counters (one for each bank) containing the address of the currently pointed memory location. In case of simultaneous reading processes evolving respectively on the two semi-arrays, the least significant bit of the address (A0) supports the multiplexing between the EVEN and the ODD banks. If A0=0, the data coming from the EVEN semi-array will be made available at the output. If A0=1, the data coming from the ODD semi-array will be made available at the output.

As it is commonly known, the reading of the two semi-arrays is carried out according to one of two different approaches. A first approach is simultaneous readings and multiplexing of the outputs. A second approach involves time readings that are out of phase.

According to the first approach, the readings are simultaneous on the two banks. The data read are stored in respective output registers and made available to the outside world in synchronization with an external clock signal. According to the second approach, the readings on the two semi-arrays have an alternate and interleaved evolution over time.

The first approach, though offering a simpler hardware implementation, limits the minimization of the start times of synchronous read cycles. For a better comprehension, it is necessary to consider the basic steps that are performed when passing from an asynchronous read mode to a synchronous read mode.

With reference to the scheme of FIG. 2, and starting the reading from an address X, the latter will be loaded on the EVEN bank counter and on the ODD bank counter, less the least significant bit (A0) of the address. The two counters will point to the same location X of the respective bank or semi-array.

If A0=0: the first read data is relative to the address X of the bank EVEN and the successive read data is the data X of the bank ODD.

If A0=1: the first read data is relative to the address X of the bank ODD and the successively read data is relative to the X+1 address of the bank EVEN.

In the first case, it is sufficient to perform a simultaneous reading of the two banks and multiplex the outputs. In the second instance, it is necessary to increment the counter before starting the reading on the bank EVEN.

Usually, known synchronous memory devices do not make any initial increment and wait for the successive cycle for incrementing both counters, and therefore, read the location X+1 of the banks EVEN and ODD. This makes the times of the first read cycle and of the second sequential read cycle at best equal to the asynchronous read mode time of the memory.

In general, it may be stated that the efficient management of the read processes has a direct influence of the performance of the memory device. Many read-path architectures have been proposed. Known read-path architectures have generally been conceived for responding efficiently to either one or the other of the two modes of operation: asynchronous or synchronous.

If a memory device is designed to be read in an asynchronous mode, it will be generally provided with a rather simple control circuitry for the read data streams. This allows the use of adaptive structures, such as dummy wordlines and dummy sense amplifiers, while leaving the reading circuitry free to evolve as fast as possible in order to achieve the shortest asynchronous access delays.

In contrast, in memory devices designed to function in a burst access mode or in a synchronous read mode, the possibility of making available in output a certain number of words read and stored in advance, permits, after a first asynchronous access, as long as it may be, a series of extremely fast read cycles. In this case though, the control logic must intervene extensively to manage the sense amplifiers which should not be left to evolve freely but be enabled, equalized and read at precise instants established by the control system. Prior European Patent Application Serial No. EP-98830801, filed on Dec. 30, 1998, and Italian Patent Application Serial No. MI99A00248, filed on Nov. 26, 1999, describe burst-mode EPROM devices with the above characteristics. These patent applications are both incorporated herein by reference in their entirety, and are assigned to the assignee of the present invention.

The access mode in a reading phase of operation is set to a specific protocol of use of two of the external protocol signals. These two signals are the address input latches enabling signal ALE and of the read stimulation signal RD.

The counters of the two semi-arrays, or the counter of the first bank and a more simpler register which functions as an address counter of the second bank, are incremented distinctly from one another. This is different from what is commonly done in interleaved memory devices. The readings are thus out of phase on the two banks from the first (asynchronous) read cycle. In this way, the memory device of the invention is perfectly able to switch to a synchronous mode reading phase at any time, which practically cuts in half the access time to such a mode.

The two different reading processes, according to an asynchronous random access mode and according to a synchronous burst access mode remain congruent with each other, having an alternate and interleaved evolution in time, as described in European Patent Application No. 00830068.3, filed on Jan. 31, 2000. This application is incorporated herein by reference in its entirety, and is assigned to the assignee of the present invention.

The architecture disclosed in the referenced patent application provides for optimal performances, uncompromised in any measure by the bivalent character of the device, whether commanded to function as a standard asynchronous random access memory or as a synchronous burst access memory. The control circuit of the memory recognizes the type of access and reading mode that is required by way of a specific protocol of use of two external commands, namely the address latch enabling signal ALE and the read simulation signal RD signal.

The start of a standard read cycle (asynchronous mode) takes place as customary when the ALE signal assumes a high logic level 1. Upon the switching to a logic 1 of the ALE signal, the memory acquires (in its input latches) the desired address and simultaneously starts up the sense circuitry of both banks.

Of course, a first cycle will always be asynchronous and the independent arrays of sense amplifiers of the two banks are simultaneously activated. If the ALE signal does not return to its rest condition, that is to a logic 0 state, the two banks of sense amplifiers will complete their respective readings, each evolving according to its own self-adapting circuits. This is the same manner as in a standard asynchronous memory.

At the end of these readings, only the bank currently in a condition of priority, determined by the value of the least significant bit of the address, will be enabled to place the read data on an internal data bus. When ADD<0>=0, this establishes the priority of the EVEN bank, and when ADD<0>=1, this establishes the priority of the ODD bank.

Under these conditions, the reading stimulation signal RD behaves as an active low Output Enable command, such that when at a logic 0 level, the data of the bank currently in priority is transferred to the output buffers, and therefore, made available to the external world.

If the ALE signal switches back to a logic 0 level during the very first read cycle or thereafter during the $n^{th}$ asynchronous random access read cycle, the control circuit interprets such an occurrence as a request for a change to a burst mode of access and to a synchronous read mode of the memory. In such a case, the control circuit generates a first increment pulse for the address counter (or optionally for the functionally equivalent register) of the bank which currently is not in priority.

In so doing, the reading of the data on the bank currently in priority is left to evolve, considering that this bank will be the first to be called to provide its data to the output of the memory, Simultaneously, the incremented address for the successive reading to be done on the other bank is prearranged (start of the synchronous burst interleaved reading mode).

The same increment pulse for the address counter (or register) of the bank currently not in priority stimulates also the respective reading circuitry of the bank. A specially modified ATD generator generates upon stimulation by the address counter incrementing pulse a dummy ATD pulse that is due to internal stimulation, and which is exclusively conveyed to the bank not in priority, and to its decoding and sensing circuits.

In this way, the array of sense amplifiers of the bank not in priority, the relative sense control circuit and equalization dummy structures, etc., will interpret the address counter incrementing pulse as a normal asynchronous read cycle request and will restart. This is while the sense amplifiers of the bank currently in priority, being completely independent from those of the other bank, will continue to evolve in their reading process.

The control circuit of the memory will continue to monitor the signals coming from the sense control of the bank in priority. As soon as the sense control circuit provides the SAlatch signal for transferring the read data to the latches immediately in cascade of the respective sense amplifiers, the control circuit will generate a pulse commanding the loading of data on the output, i.e., a LOAD pulse. In this way, the functioning enters in a burst interleaved access mode.

The end of the LOAD pulse establishes the availability of the bank that has just terminated a read cycle to start a new read cycle. Therefore, a new address counter incrementing signal will be generated only for the counter (or equivalent register) of such a bank, which besides stimulating the generation of a sequentially updated internal address, will cause the generation of a new ATD pulse by internal stimulation (dummy). This is exclusively conveyed to the circuitry of such a bank.

These succession of address counter incrementing pulses have also the function of commuting the priority between the two banks in an alternate manner. In fact, because the first bank has terminated a read cycle and is about to start a new one, the bank that was not in priority and that in the meanwhile had restarted on its up-dated address, assumes priority.

Therefore, the control circuit of the memory will again wait for information coming from the asynchronous and self-adapting structures of sense control of such a bank as well as for an authorization by the external command RD to output the data of such a bank by the generation of a new LOAD pulse. From hereon, the steps described above may repeat indefinitely, alternating the sequence.

According to a preferred embodiment, the circuit that detects transitions in the latches acquiring the externally requested addresses generates a detection signal ATD even upon a switching of the outputs. This is during a phase of reentering from a state of standby with the external command ALE=0, and besides the acquisition of a new address from outside during a phase of random access or upon the incrementing of one the other address counters of the two banks during a phase of sequential access. This provides for a useful resume&recovery functionality, such as for producing in output the last read data before entering the phase of standby, or the data relative to the sequentially successive address. This depends on the logic state of the RD command at the moment of interrupting the sequential reading and entering in a phase of standby of the memory.

From the above mentioned reasons it is clear the importance to ensure an address updating that is as rapid as possible when an increment pulse is detected during a synchronous read access (burst mode) for selecting a new memory location. Commonly, the address counters are binary counters in which the carry propagation chain determines or limits its speed.

According to known techniques, the commonly used binary counters are based on a Carry Look Ahead architecture (CLA), according to a circuit diagram as the one depicted in FIG. 5. Such a common architecture of binary counter in the form of a CLA adder, besides requiring the integration of a relatively complex hardware, has speed limits imposed by the delays of the carry propagation chain.

SUMMARY OF THE INVENTION

In view of the foregoing background, the present invention provides an excellent approach to the problem of the carry propagation in binary counters by reducing in a non-negligible manner the propagation time by using a particular carry calculation network.

Such a network is formed by an ordered set of carry generators, with each one calculating a carry for a respective group of stages of the counter. These generators are substantially carry calculation networks having a lesser number of stages than the counter.

While the commonly used address counters are provided with a carry calculation network ideally obtained by connecting in cascade several carry generators, the counter of the invention has a carry calculation network obtained by connecting in parallel such generators by AND gates.

The first carry generator of the counter of the invention is coupled to the same addresses of the first carry generator of the known counters. On the contrary, the successive generators of the invention do not receive, at the respective input of the carry bit, the bit CARRY related to the most significant bit of the preceding generator in the ordered group as in the known structures. Instead, they receive a carry bit quickly calculated by carrying out the logic AND of all the addresses of the previous generator.

The carry bit is quickly calculated and coincides with the CARRY calculated by the preceding generator, because a CARRY is produced only when all the respective input bits are 1. The main advantage of this architecture includes the fact that the generators work in parallel, with a definite saving of time. In contrast, the carry generators in known counters work sequentially, that is the nth generator can work only when the n−1$^{th}$ generator that precedes it in the ordered group has terminated its own cycle.

BRIEF DESCRIPTION OF THE DRAWINGS

The different aspects and advantages of the invention will become clearer through a detailed description of the invention with reference to the attached drawings wherein.

DETAILED DESCRIPTION OF THE PREFERRED EMBODIMENTS

Figure 1:
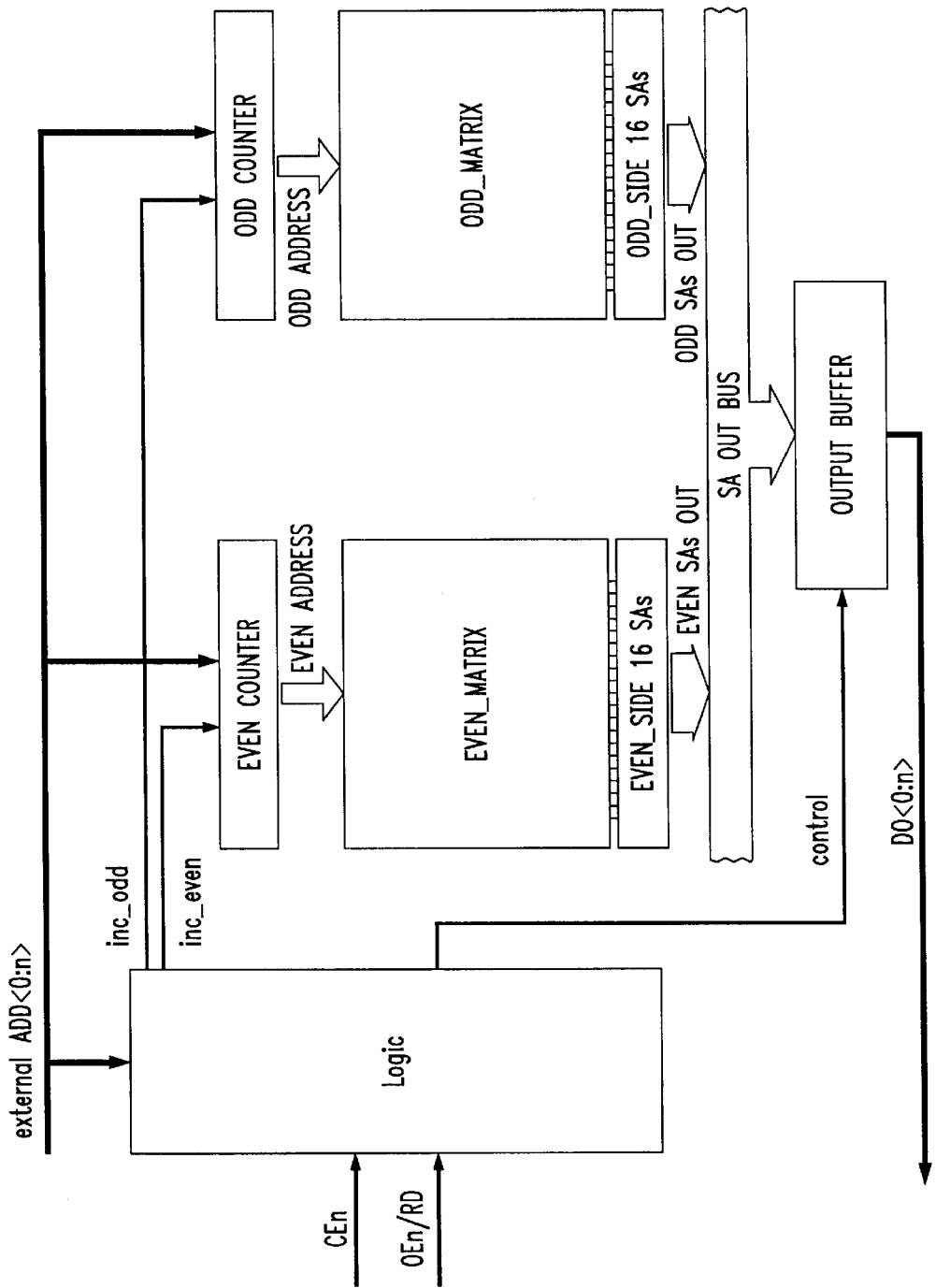
FIG. 1 is a basic diagram of an interleaved memory according to the prior art.
Figure 2:
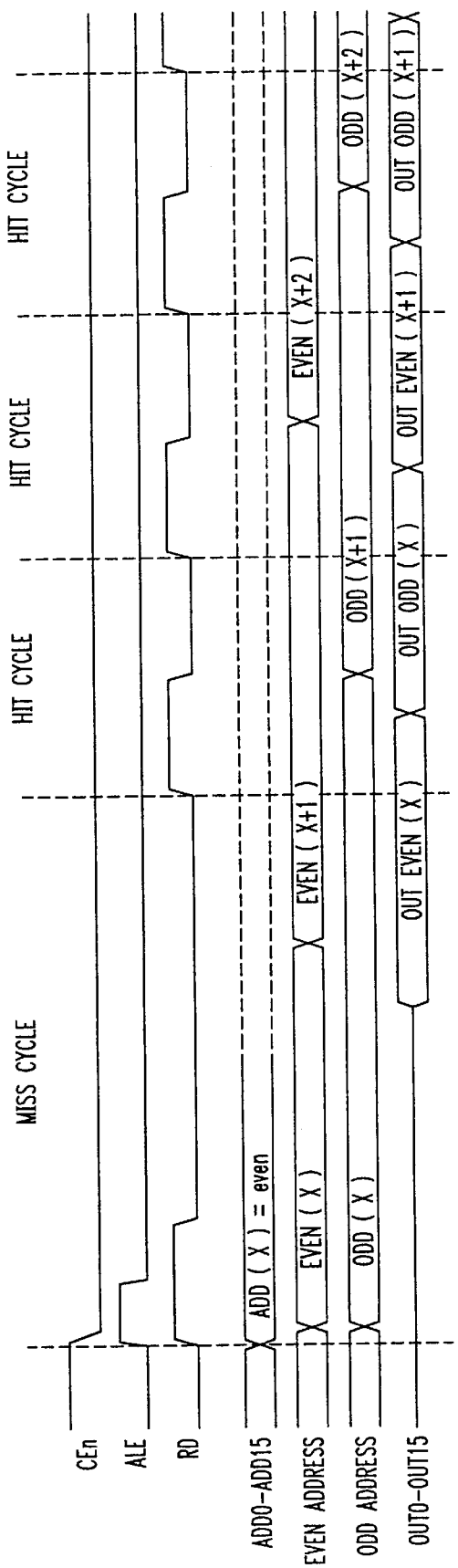
FIGS. 2 and 3 are timing diagrams of the main signals that are generated during an access to the banks of an interleaved memory according to the prior art.
Figure 3:
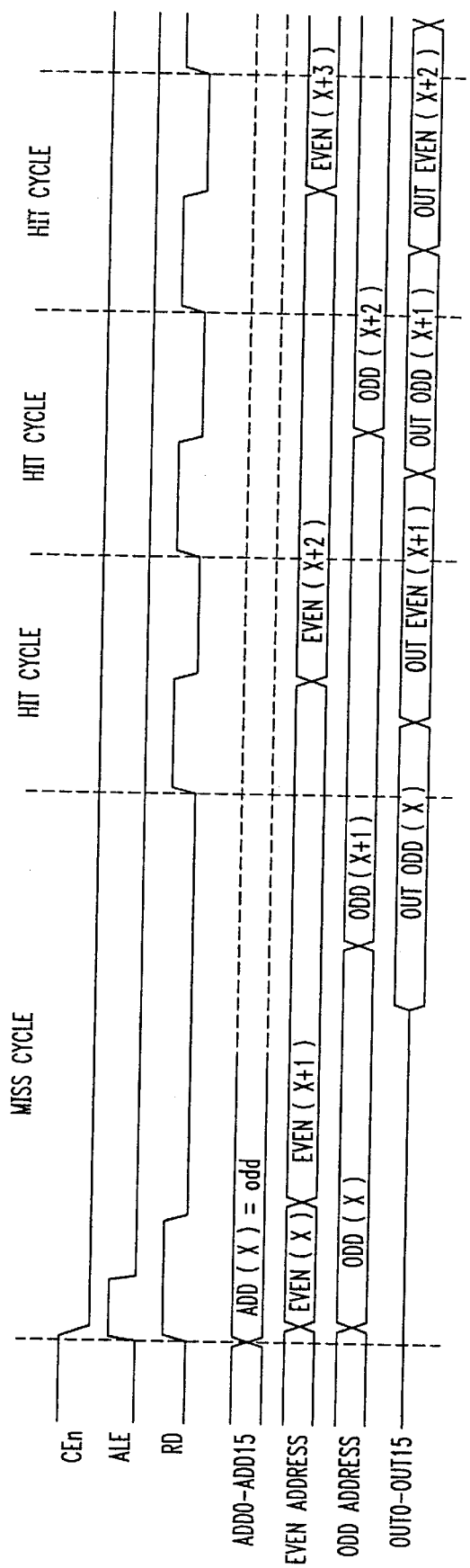

In order to support the timing of the interleaved memory, as depicted in FIGS. 2 and 3, increments for banks EVEN/ODD must be made depending on whether the start address for burst readings is set for the EVEN or for the ODD bank. As shown in the referenced figures, the successive readings are interleaved between the banks ODD and EVEN in burst mode.

Figure 4:
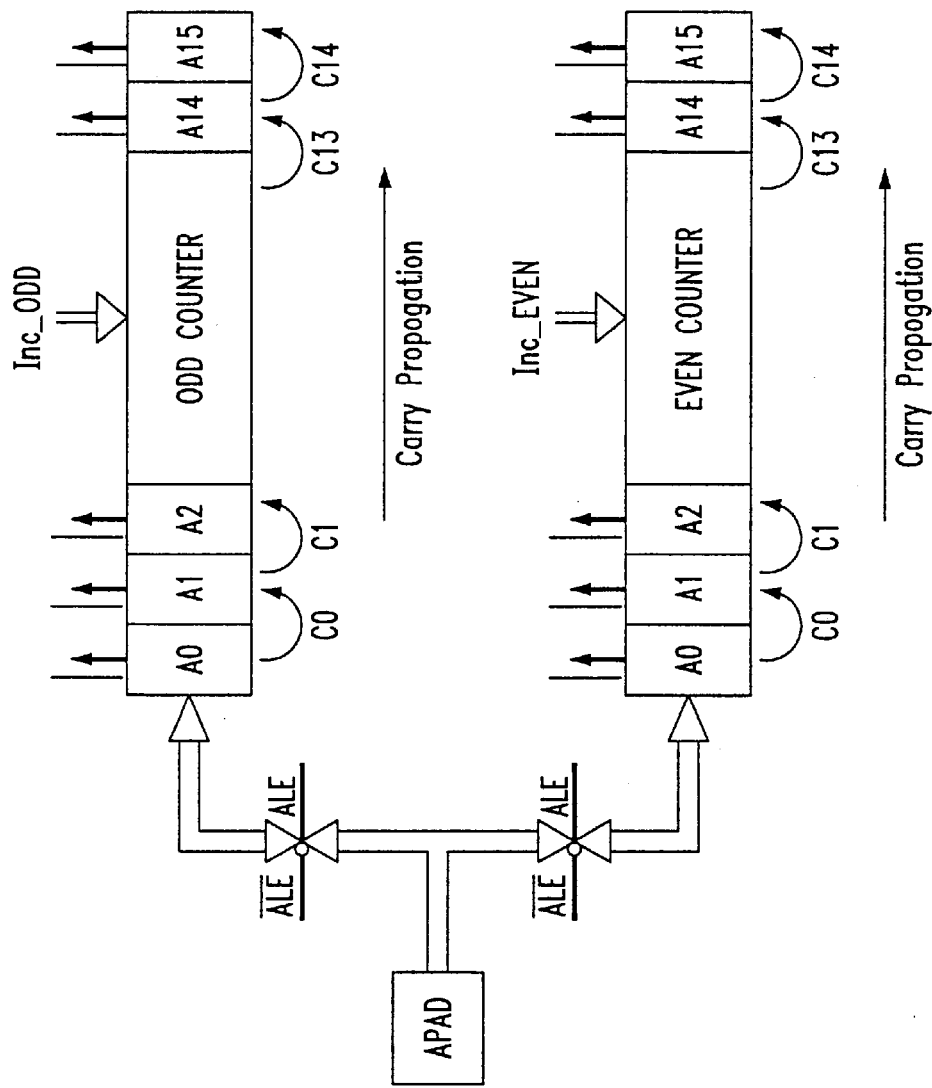
FIG. 4 is the architecture of a common address counter for an interleaved memory according to the prior art.
Figure 5:
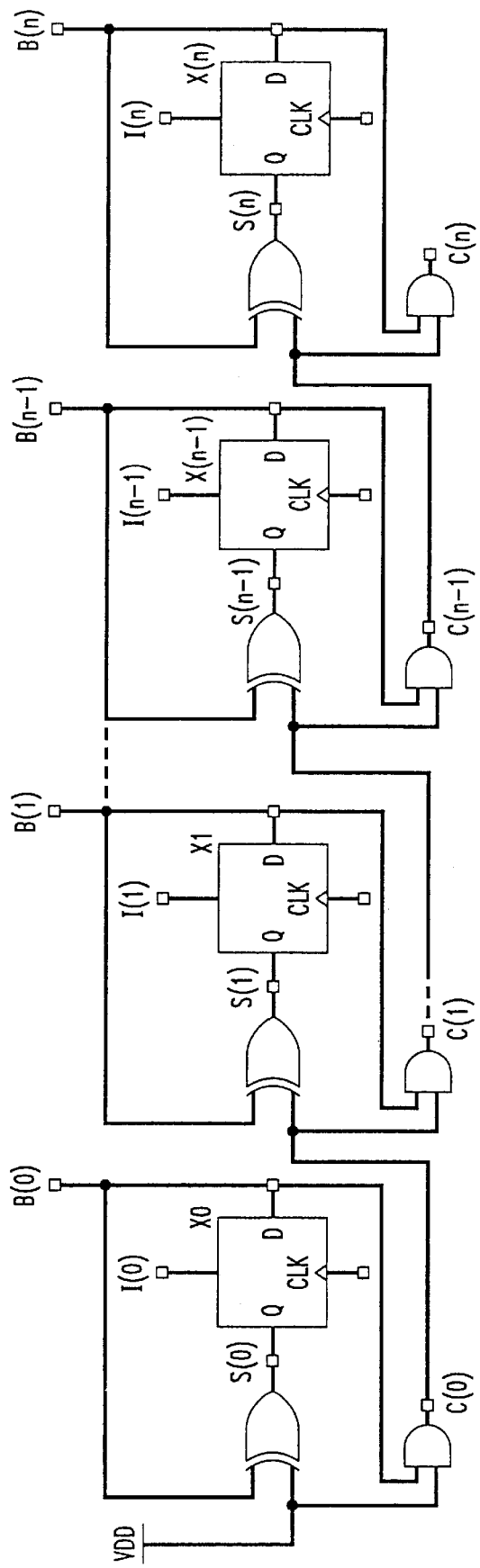
FIG. 5 shows the organization of the logic circuit includes the counter according to the prior art.

The increments of the address counters EVEN and ODD are controlled by two different increment clocks, called INC_EVEN and INC_ODD, respectively, as depicted in FIG. 4, which are generated by a burst timing control logic. According to the known technique, an N-bit binary counter is composed of N flip-flop latches and N half adder stages connected in cascade, as depicted in FIG. 5. Each half adder stage has an input for a carry bit coming from the previous stage, and an input for an address coming from the corresponding latch.

Figure 6:
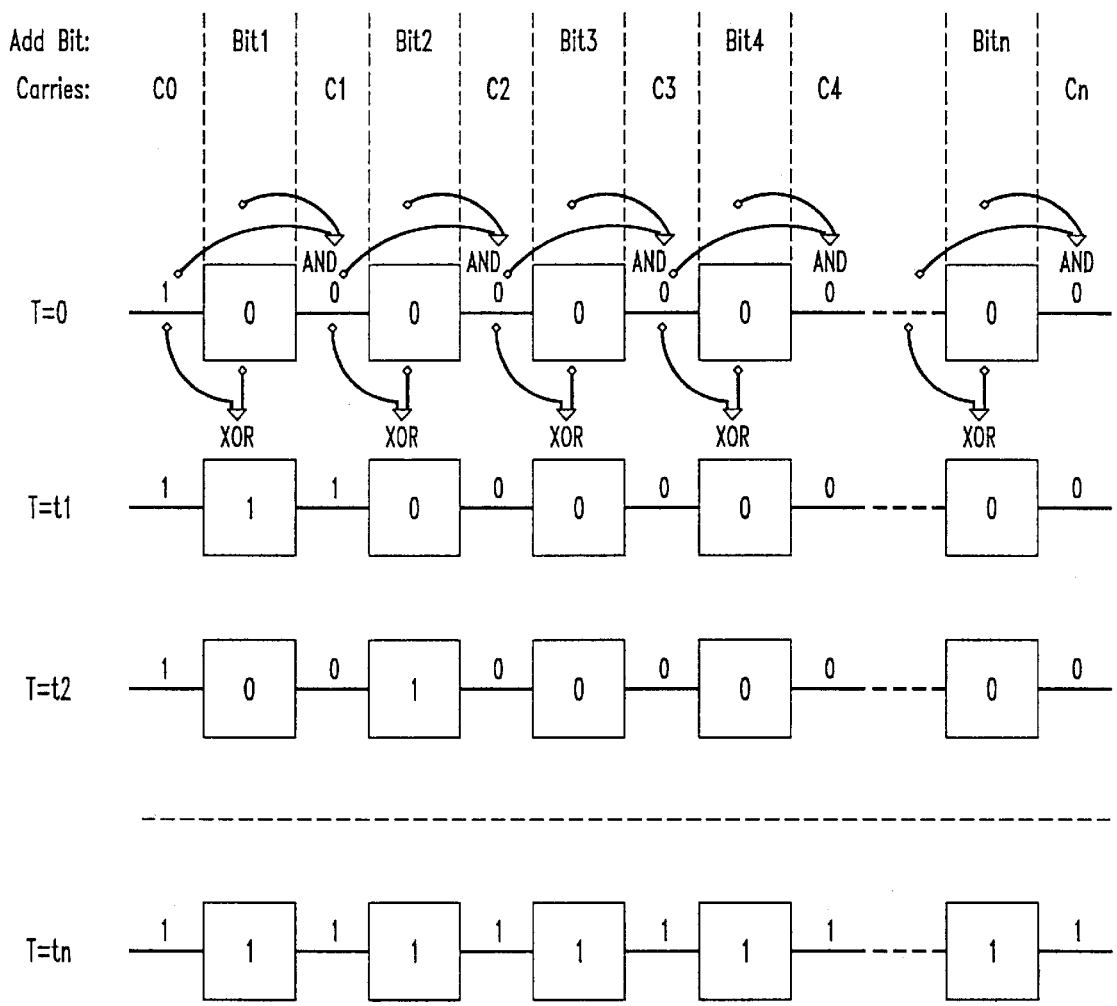
FIG. 6 schematically shows the evolution of the stages of the counter of FIG. 5.

In FIG. 6 it is schematically shown how the address bits BIT1, . . . , BITN and the bit carries C0, . . . , CN are generated at each transition T, according to the following relations:

SUM=InpA XOR InpB

CARRY=InpA AND InpB

In the carry propagation chain of the binary counters that are commonly used as address counters, the carry bits are generated by ANDing the address bit and the carry bit coming from the preceding stage. This means that it is necessary to wait for the propagation of the signals through n−1 stages before having information on the carry bit of the nth stage. In case of counters with a large number of stages, the delay of such a propagation may be intolerable with high speed requirements.

Figure 7A:
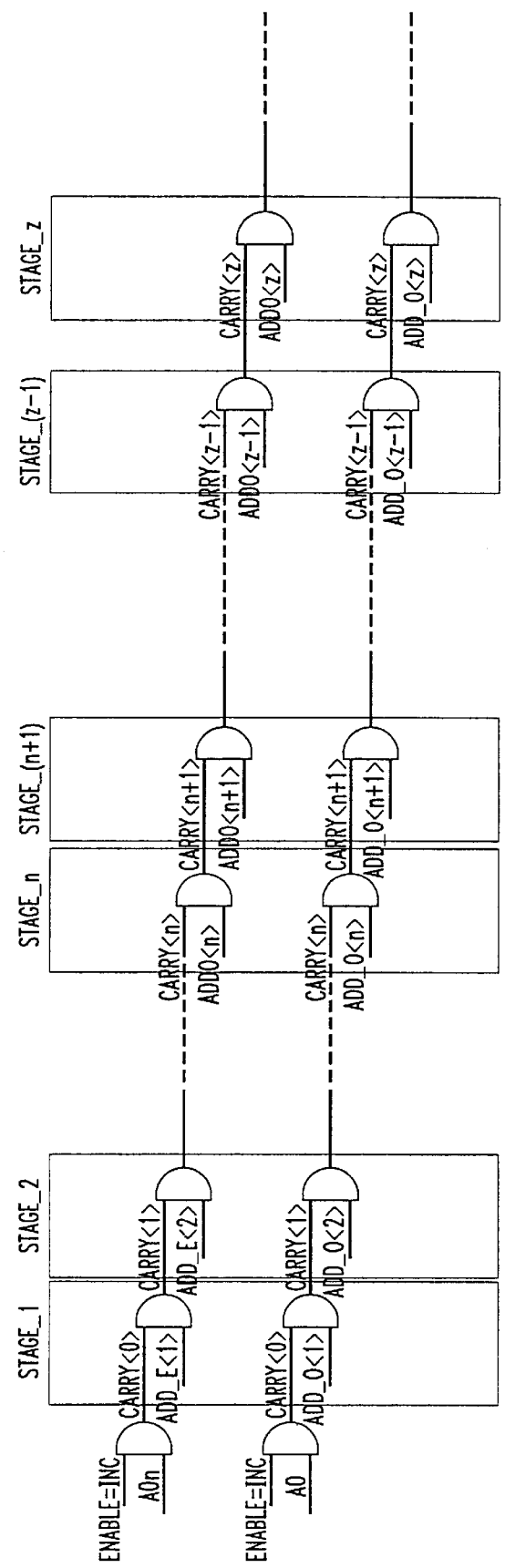
FIG. 7a is the diagram of the carry calculation network of a common counter according to the prior art.

The carry calculation network of the known counters, depicted in FIG. 5, composed of AND gates and stages comprising a half adder (XOR gates) and a latch, can be seen as a modular structure formed by different stages of AND gates in cascade, each connected to an address bit and to a carry bit CARRY<N>, as depicted in FIG. 7a. It is evident that the last stage ends its own operation only after all the stages upstream have finished since the stages are connected in cascade.

Figure 7B:
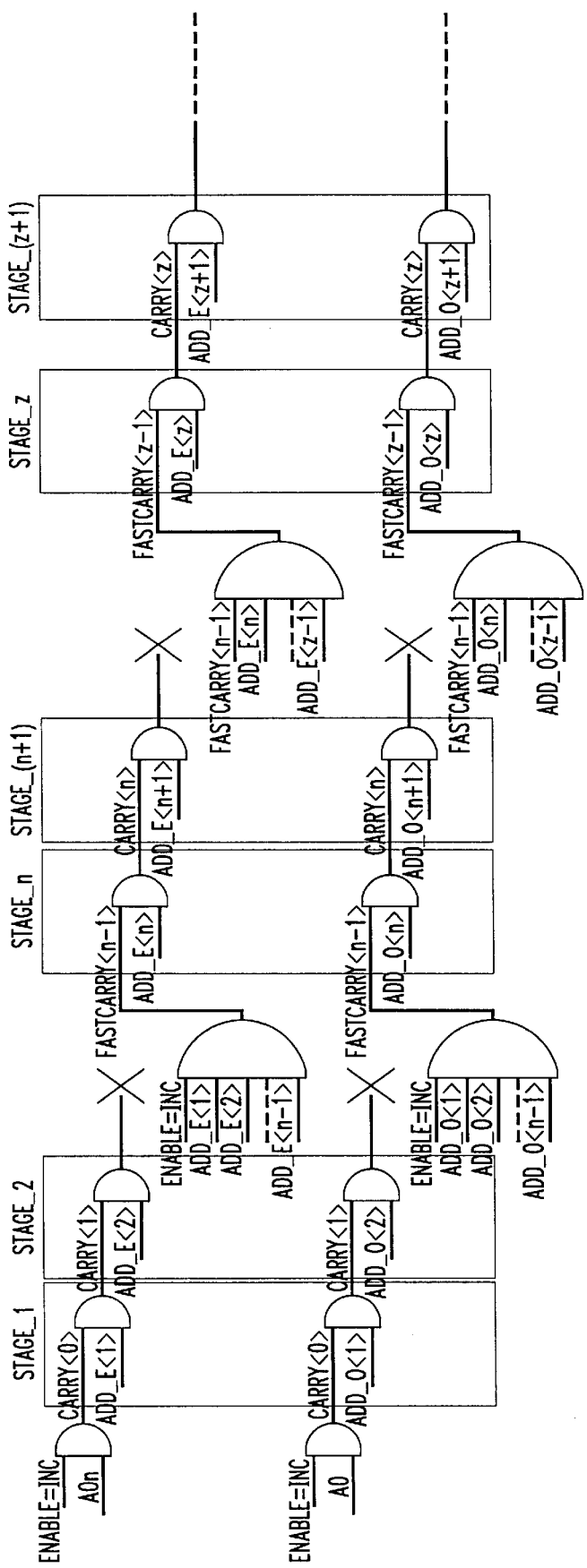
FIG. 7b is the diagram of the carry calculation network of the counter according to the present invention.

In contrast, the counter of the invention has a carry calculation network realized as depicted in FIG. 7b. The different stages of AND gates are grouped together and each group (STAGE_N, STAGE_N+1, . . . , STAGE_Z−1) forms a carry generator for a group of successive address bits. The different carry generators form an ordered group, wherein the generators producing a carry bit for least significant address bits precedes in the order the ones related to the most significant bits.

The network of FIG. 7b differs from the known network of FIG. 7a because the generators are connected in parallel by means of AND gates, input with the address bit and with a bit resulting from the quick carry calculation of the previous carry generator.

The carry generators, as depicted in FIG. 7b, work in parallel because each one of them is input with the carry, relative to the most significant address bit of the preceding generator in the ordered group, before the preceding generator has calculated it. This is possible because the input AND gate of a carry generator quickly calculates a bit FASTCARRY<Z−1> equal to CARRY.

A carry generator produces a CARRY only if all its inputs (ADD_E<N>, ADD_E<N+1>, . . . , ADD_E<Z−1>, FASTCARRY<N−1>) are active. The carry can thus be quickly calculated by ANDing all its inputs. The ability to calculate the carry at the input of a carry generator, before the carry generator that precedes it in the ordered group has terminated its operation, allows the different generators to work in parallel with a consequent saving of time.

This characteristic makes the present invention particularly suitable in memories designed for operating at relatively high clock frequencies, such as the memories using a burst protocol. It must be highlighted that a carry generator may have any number of stages, for example, all generators may have the same number of stages or, to make all carry generators finish at the same time, they may have a number of stages progressively decreased starting from the first generator to the last generator of the ordered group.

That which is claimed is:

1. An address binary counter for an interleaved memory having an array of memory cells being divided into a first bank of memory cells and a second bank of memory cells, each bank of memory cells being organized into rows and columns and the interleaved memory operating in a burst access mode responsive to an enabling signal, the address binary counter comprising:
    a plurality of stages equal to a number of address bits for storing in memory cells of a row in one of the first and second banks of memory cells; and
    a carry calculation network comprising an ordered group of independent carry generators each having a predetermined number of stages, and each independent carry generator including an input for receiving an enabling bit and inputs for receiving a number of consecutive bits of a row in one of the first and second banks of memory cells, the enabling bit of a first carry generator of the ordered group of independent carry generators is the enabling signal, and the enabling bit of any other carry generator of the ordered group of independent carry generators is a logic AND of the enabling signal and of input bits of a preceding carry generator of the ordered group of independent carry generators, and an output for providing a carry bit.

2. A binary counter according to claim 1, wherein the number of consecutive bits for each independent carry generator is equal to a number of its stages orderly starting from a least significant bit.

3. A binary counter according to claim 1, wherein said ordered group of independent carry generators have a same number of stages.

4. A binary counter according to claim 1, wherein said ordered group of independent carry generators have a number of stages that progressively decrease at a unitary rate.

5. An interleaved memory comprising:
    an array of memory cells being divided into a first bank of memory cells and a second bank of memory cells; and
    first and second address binary counters respectively connected to said first and second banks of memory cells, each address binary counter comprising
        a plurality of stages for storing in memory cells of a row in one of said first and second banks of memory cells, and
        a carry calculation network comprising an ordered group of independent carry generators, and each independent carry generator including an input for receiving an enabling bit and inputs for receiving a number of consecutive bits of a row in one of said first and second banks of memory cells, and an output for providing a carry bit.

6. An interleaved memory according to claim 5, wherein the plurality of stages is equal to a number of address bits for storing in the memory cells of the row in one of said first and second banks of memory.

7. An interleaved memory according to claim 5, wherein each independent carry generator has a predetermined number of stages.

8. An interleaved memory according to claim 5, wherein the enabling bit of a first carry generator of said ordered group of independent carry generators is the enabling signal, and the enabling bit of any other carry generator of said ordered group of independent carry generators is a logic AND of the enabling signal and of input bits of a preceding carry generator of said ordered group of independent carry generators.

9. An interleaved memory according to claim 5, wherein said ordered group of independent carry generators have a same number of stages.

10. An interleaved memory according to claim 5, wherein said ordered group of independent carry generators have a number of stages that progressively decrease at a unitary rate.

11. An interleaved memory according to claim 5, wherein the interleaved memory operates in a burst access mode responsive to the enabling signal.

12. An interleaved memory according to claim 5, wherein the number of consecutive bits for each independent carry generator is equal to a number of its stages orderly starting from a least significant bit.

13. An interleaved memory according to claim 5, further comprising:
    first and second arrays of sense amplifiers respectively coupled to said first and second banks of memory cells; and
    an array of output buffers connected to said first and second arrays of sense amplifiers.

14. A method for calculating a carry bit for an address binary counter for an interleaved memory having an array of memory cells being divided into a first bank of memory cells and a second bank of memory cells, each bank of memory cells being organized into rows and columns, the method comprising:
    using a plurality of stages for storing in memory cells of a row in one of the first and second banks of memory cells for forming an address binary counter; and
    performing carry calculations by using a carry calculation network comprising an ordered-group of independent carry generators, and each independent carry generator includes an input for receiving an enabling bit and inputs for receiving a number of consecutive bits of a row in one of the first and second banks of memory cells, and an output for providing the carry bit.

15. A method according to claim 14, wherein the plurality of stages is equal to a number of address bits for storing in the memory cells of the row in one of said first and second banks of memory.

16. A method according to claim 14, wherein each independent carry generator has a predetermined number of stages.

17. A method according to claim 14, wherein the enabling bit of a first carry generator of the ordered group of independent carry generators is the enabling signal, and the enabling bit of any other carry generator of the ordered group of independent carry generators is a logic AND of the enabling signal and of input bits of a preceding carry generator of the ordered group of independent carry generators.

18. A method according to claim 14, wherein the ordered group of independent carry generators have a same number of stages.

19. A method according to claim 14, wherein the ordered group of independent carry generators have a number of stages that progressively decrease at a unitary rate.

20. A method according to claim 14, wherein the interleaved memory operates in a burst access mode responsive to the enabling signal.

21. A method according to claim 14, wherein the number of consecutive bits for each independent carry generator is equal to a number of its stages orderly starting from a least significant bit.

* * * * *